(12) United States Patent
Sakaue

(10) Patent No.: US 11,029,791 B2
(45) Date of Patent: Jun. 8, 2021

(54) TOUCH PANEL INCLUDING A LAYERED STRUCTURE WITH FIRST AND SECOND MESH TERMINAL LAYERS DIRECTLY OVERLAID ON EACH OTHER AND TOUCH PANEL PRODUCTION METHOD

(71) Applicant: JAPAN AVIATION ELECTRONICS INDUSTRY, LIMITED, Tokyo (JP)

(72) Inventor: Akitoshi Sakaue, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 85 days.

(21) Appl. No.: 16/170,526

(22) Filed: Oct. 25, 2018

(65) Prior Publication Data
US 2019/0129536 A1 May 2, 2019

(30) Foreign Application Priority Data

Oct. 31, 2017 (JP) .............................. JP2017-210778

(51) Int. Cl.
*G06F 3/044* (2006.01)
*B41M 3/00* (2006.01)
*H05K 3/12* (2006.01)

(52) U.S. Cl.
CPC ........... *G06F 3/0445* (2019.05); *B41M 3/006* (2013.01); *G06F 3/0446* (2019.05);
(Continued)

(58) Field of Classification Search
CPC .... G06F 3/041; G06F 3/0416; G06F 3/04164; G06F 3/044; G06F 3/0445; G06F 3/0446;
(Continued)

(56) References Cited

U.S. PATENT DOCUMENTS

2013/0334017 A1* 12/2013 Hwang ................ H01H 1/5805
200/284
2014/0152910 A1* 6/2014 Kang .................... G06F 1/1643
349/12
(Continued)

FOREIGN PATENT DOCUMENTS

CN        105425992 A      3/2016
JP        2017-103317 A    6/2017
(Continued)

OTHER PUBLICATIONS

Office Action issued in Republic of Korea Counterpart Patent Appl. No. 10-2018-0128268, dated Oct. 21, 2019, along with an English translation thereof.

(Continued)

*Primary Examiner* — Keith L Crawley
(74) *Attorney, Agent, or Firm* — Greenblum & Bernstein, P.L.C.

(57) ABSTRACT

A touch panel comprises, a substrate, a layered structure formed in a sensing region defined on one side of the substrate, the layered structure including at least a first conductor layer made of a first hardened conductive ink, a second conductor layer made of a second hardened conductive ink and an insulating layer disposed therebetween, and an external connection terminal formed outside the sensing region on the one side of the substrate, wherein the external connection terminal comprises a first terminal layer made of the first hardened conductive ink and a second terminal layer made of the second hardened conductive ink, such that the first terminal layer and the second terminal layer are directly overlaid on each other.

12 Claims, 9 Drawing Sheets

(52) U.S. Cl.
CPC ........ *H05K 3/1275* (2013.01); *B41P 2200/13* (2013.01); *G06F 2203/04103* (2013.01); *G06F 2203/04112* (2013.01); *H05K 2203/0534* (2013.01)

(58) Field of Classification Search
CPC ............ G06F 2203/04103; G06F 2203/04112; B41M 3/006; B41P 2200/13; H05K 1/11; H05K 1/111; H05K 1/112; H05K 3/12; H05K 3/1275; H05K 2203/0534
See application file for complete search history.

(56) References Cited

U.S. PATENT DOCUMENTS

| | | |
|---|---|---|
| 2014/0231120 A1 | 8/2014 | Nakamura |
| 2015/0049263 A1 | 2/2015 | Chu et al. |
| 2015/0199049 A1* | 7/2015 | Yang ..................... H01L 27/323 345/174 |
| 2017/0090652 A1* | 3/2017 | Sato ....................... G06F 3/0416 |
| 2017/0156218 A1 | 6/2017 | Kogawa et al. |
| 2017/0185187 A1* | 6/2017 | Nakayama .............. G06F 3/044 |
| 2017/0221196 A1 | 8/2017 | Yamaguchi et al. |
| 2017/0352706 A1* | 12/2017 | Choi ...................... G06F 3/0443 |
| 2017/0371453 A1* | 12/2017 | Nakayama ............... H05K 1/09 |
| 2018/0018051 A1* | 1/2018 | Ogura ..................... G06F 3/041 |
| 2018/0061897 A1* | 3/2018 | Oh .......................... G06F 3/044 |
| 2018/0307344 A1* | 10/2018 | Ishii ........................ G06F 3/044 |
| 2019/0346971 A1* | 11/2019 | Ikeda ..................... G06F 3/0446 |

FOREIGN PATENT DOCUMENTS

| | | |
|---|---|---|
| JP | 2017-103318 A | 6/2017 |
| KR | 10-2013-0073859 | 7/2013 |
| KR | 10-2014-0070103 | 6/2014 |
| KR | 10-2017-0058402 | 5/2017 |
| TW | M479457 U | 6/2014 |
| TW | 201432527 A | 8/2014 |
| TW | M5116464 U | 11/2015 |
| TW | 201606598 A | 2/2016 |

OTHER PUBLICATIONS

Office Action issued in Taiwan family member Patent Appl. No. 107138159, dated Jul. 26, 2019, along with an English translation thereof.

* cited by examiner

TOUCH PANEL INCLUDING A LAYERED STRUCTURE WITH FIRST AND SECOND MESH TERMINAL LAYERS DIRECTLY OVERLAID ON EACH OTHER AND TOUCH PANEL PRODUCTION METHOD

TECHNICAL FIELD

The present invention relates to a touch panel that is produced using a printing process and a method for producing such a touch panel.

BACKGROUND ART

FIGS. 1, 2A and 2B illustrate a configuration of a capacitive touch panel described in Japanese Patent Application Laid Open No. 2017-103317 (published on Jun. 8, 2017, hereinafter referred to as Literature 1) as an example of a conventional touch panel of this type. The touch panel comprises a first conductor layer, an insulating layer, a second conductor layer, and a protective coating which are stacked in this order on a transparent substrate (substrate plate) 10. An area enclosed in a rectangular frame in FIG. 1 is a sensing region (sensor region) 20 in which sensor electrodes are located. Details of the sensor electrodes are omitted from FIG. 1.

The sensor electrodes include a first sensor electrode and a second sensor electrode. The first sensor electrode is formed from a first conductor layer and the second sensor electrode is formed from a second conductor layer.

As illustrated in FIG. 2A, the first sensor electrode 30 comprises a plurality of electrode rows 33 parallelly arranged in the Y direction parallel to the short side 22 of the sensing region 20, where each of the electrode rows 33 is made up of a plurality of island-like electrodes 31 arranged in the X direction parallel to the long side 21 of the sensing region 20 and linked with one another through linkage parts 32.

As illustrated in FIG. 2B, the second sensor electrode 40 comprises a plurality of electrode rows 43 parallelly arranged in the X direction, and each of the electrode rows 43 is made up of a plurality of island-like electrodes 41 arranged in the Y direction and linked with one another through linkage parts 42.

Each of the first sensor electrode 30 and the second sensor electrode 40 is formed of a mesh of fine lines, the electrode rows 33 and the electrode rows 43 intersect each other and are insulated from each other, and the linkage parts 32 and 42 are positioned in locations that coincide with each other.

Leads 51 are extended from both ends of each electrode row 33 of the first sensor electrode 30 in the X direction and leads 52 are extended from one end of each electrode row 43 of the second sensor electrode 40 in the Y direction. A plurality of leads 51, 52 arranged in an array and extended from the sensing region 20 other than the leads 51, 52 at both ends of the array are omitted from FIG. 1.

Terminals 53 are formed in an array in a center portion of one of the long sides of the rectangular substrate 10 and the leads 51, 52 extend and are connected to each terminal 53. Ground wirings 54 formed in a peripheral part of the substrate 10 to enclose the sensing region 20 and the leads 51, 52 are also connected to the terminals 53.

The leads 51, 52 and the terminals 53 are formed from the first conductor layer and the ground wirings 54 are formed in each of the first and second conductor layers.

The first and second conductor layers which have the configuration described above are formed by gravure offset printing using conductive ink containing conductive particles such as silver particles in this example.

On the other hand, FIG. 3 illustrates a configuration of a capacitive touch panel described in Japanese Patent Application Laid Open No. 2017-103318 (published on Jun. 8, 2017, hereinafter referred to as Literature 2). Like the touch panel illustrated in FIGS. 1, 2A and 2B, this touch panel comprises a first conductor layer, an insulating layer, a second conductor layer, and a protective coating which are stacked in this order on a transparent substrate. Note that components that are equivalent to components of the touch panel illustrated in FIGS. 1, 2A and 2B are given the same reference numerals as those in FIGS. 1, 2A and 2B.

In the touch panel illustrated in FIG. 3, each of the electrode rows 33 of the first sensor electrode 30 is made up of a plurality of island-like electrodes 31 linked with one another through jumper lines 34. Only the jumper lines 34 are formed from the second conductor layer and the second sensor electrode 40, the leads 51, 52, the terminals 53 and the island-like electrodes 31 of the first sensor electrode 30 are formed from the first conductor layer. Both ends of each jumper line 34 are connected to the island-like electrodes 31 via through holes 35 provided in the insulating layer respectively and the jumper lines 34 and the linkage parts 42 of the second sensor electrode 40 are positioned in locations that coincide with each other.

While details are omitted from FIG. 3, the second sensor electrode 40, the island-like electrodes 31 of the first sensor electrode 30, and the terminals 53 are formed of meshes of fine lines and the first and second conductor layers which have the configurations described above are formed by gravure offset printing using conductive ink as in the touch panel illustrated in FIGS. 1, 2A and 2B.

As described above, the touch panel is provided with terminals (external connection terminals) for connecting to an external circuit at one side of the transparent substrate. The external connection terminals are formed from the first conductor layer formed by the gravure offset printing in each of the touch panels in Literatures 1 and 2 described above. Literature 2 states that the external connection terminals are formed of meshes of fine lines.

However, external connection terminals in the form of a mesh of fine lines formed by printing as described above have a problem that the external connection terminals in general inevitably have a larger contact resistance than external connection terminals made of a solid film and therefore it is difficult to accomplish a good and stable electrical connection state by such external connection terminals.

SUMMARY OF THE INVENTION

An object of the present invention is to provide a touch panel provided with an external connection terminal having electrical connection quality improved over conventional external connection terminals and a method for producing such a touch panel.

According to the present invention, a touch panel comprises, a substrate, a layered structure formed in a sensing region defined on one side of the substrate, the layered structure including at least a first conductor layer made of a first hardened conductive ink, a second conductor layer made of a second hardened conductive ink and an insulating layer disposed therebetween, and an external connection terminal formed outside the sensing region on the one side of the substrate, wherein the external connection terminal comprises a first terminal layer made of the first hardened conductive ink and a second terminal layer made of the second hardened conductive ink, such that the first terminal layer and the second terminal layer are directly overlaid on each other.

According to the present invention, a touch panel production method for producing the touch panel described above comprises a first printing step of simultaneously printing the first conductor layer and the first terminal layer on the one side of the substrate by using a first conductive ink, a second printing step of printing the insulating layer by using an insulating ink, and a third printing step of simultaneously printing the second conductor layer and the second terminal layer by using a second conductive ink.

The present invention can provide a touch panel provided with a external connection terminal having improved electrical connection quality and enables good and stable electrical connection to an external circuit.

Further, a method for producing a touch panel according to the present invention can advantageously produce such a touch panel.

DETAILED DESCRIPTION OF THE EMBODIMENTS

Example embodiments of the present invention will be described below.

Figure 4A:
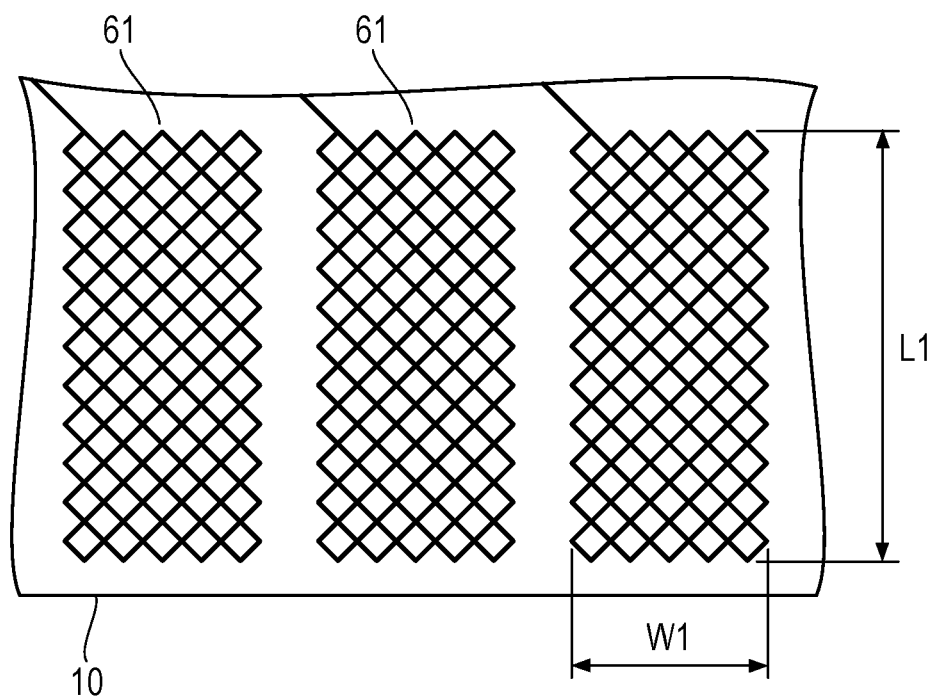
FIG. 4A is a partial enlarged view illustrating a first terminal layer in one example embodiment of a touch panel according to the present invention.
Figure 4B:
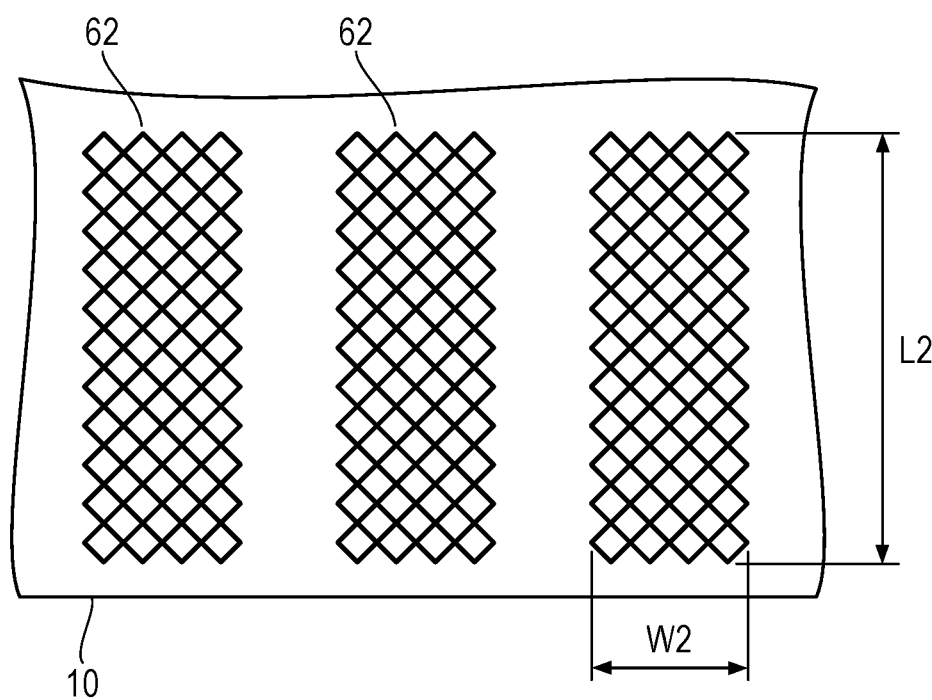
FIG. 4B is a partial enlarged view illustrating a second terminal layer in one example embodiment of the touch panel according to the present invention.
Figure 5:
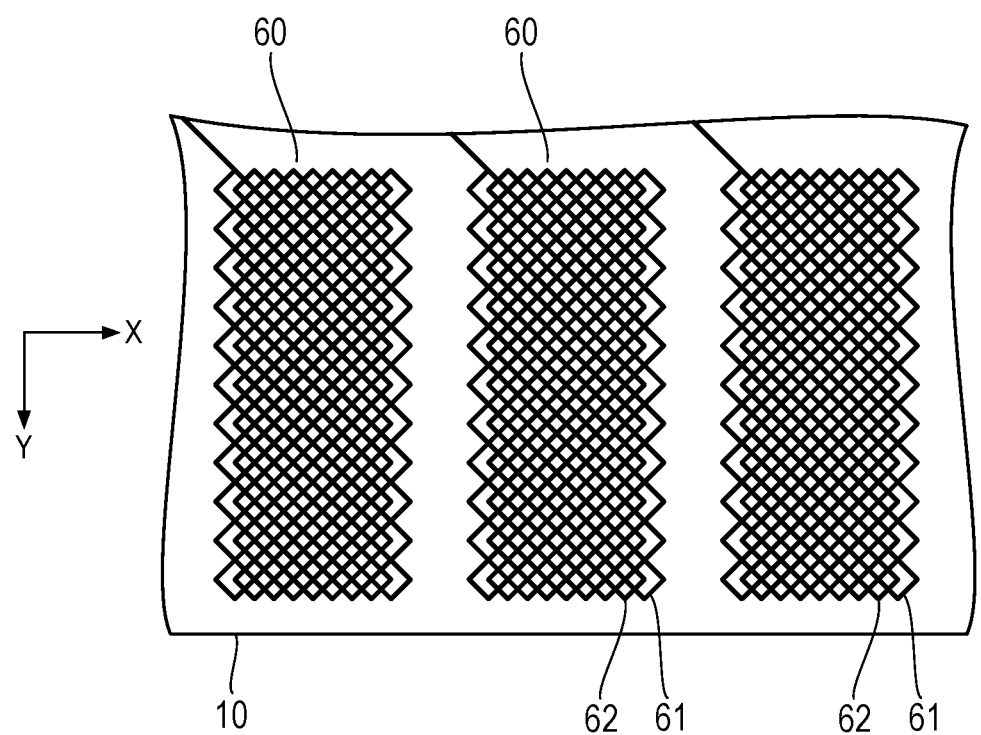
FIG. 5 is a partial enlarged view illustrating the first terminal layer illustrated in FIG. 4A and the second terminal layer illustrated in FIG. 4B which are overlaid on one another.
Figure 6:
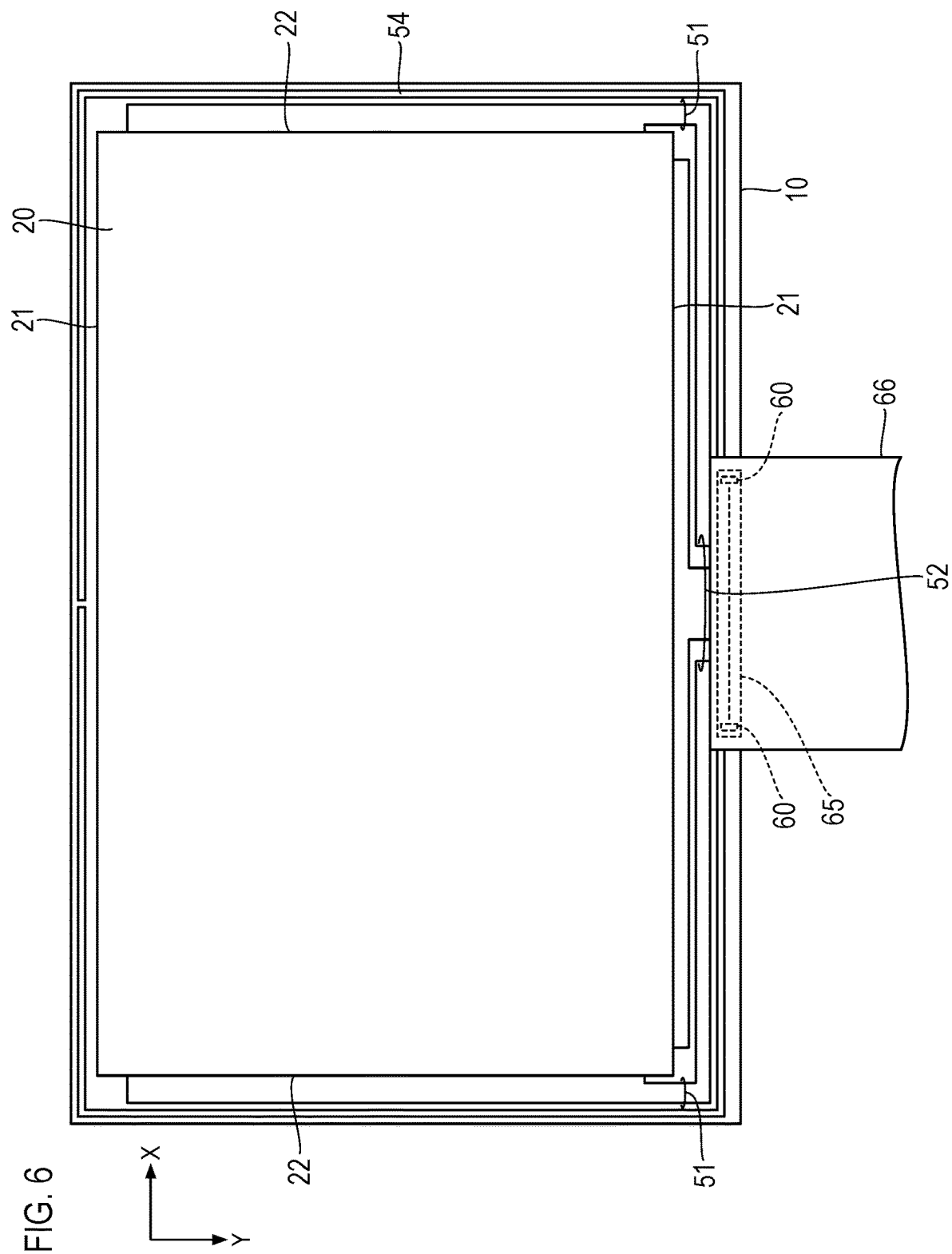
FIG. 6 is a diagram illustrating the touch panel connected with an FPC, which is an external circuit.

FIGS. 4A, 4B and 5 illustrate details of external connection terminals of one example embodiment of a touch panel according to the present invention and FIG. 6 illustrates the example embodiment of the touch panel according to the present invention with an FPC, which is an external circuit, connected with the external connection terminals.

Figure 1:
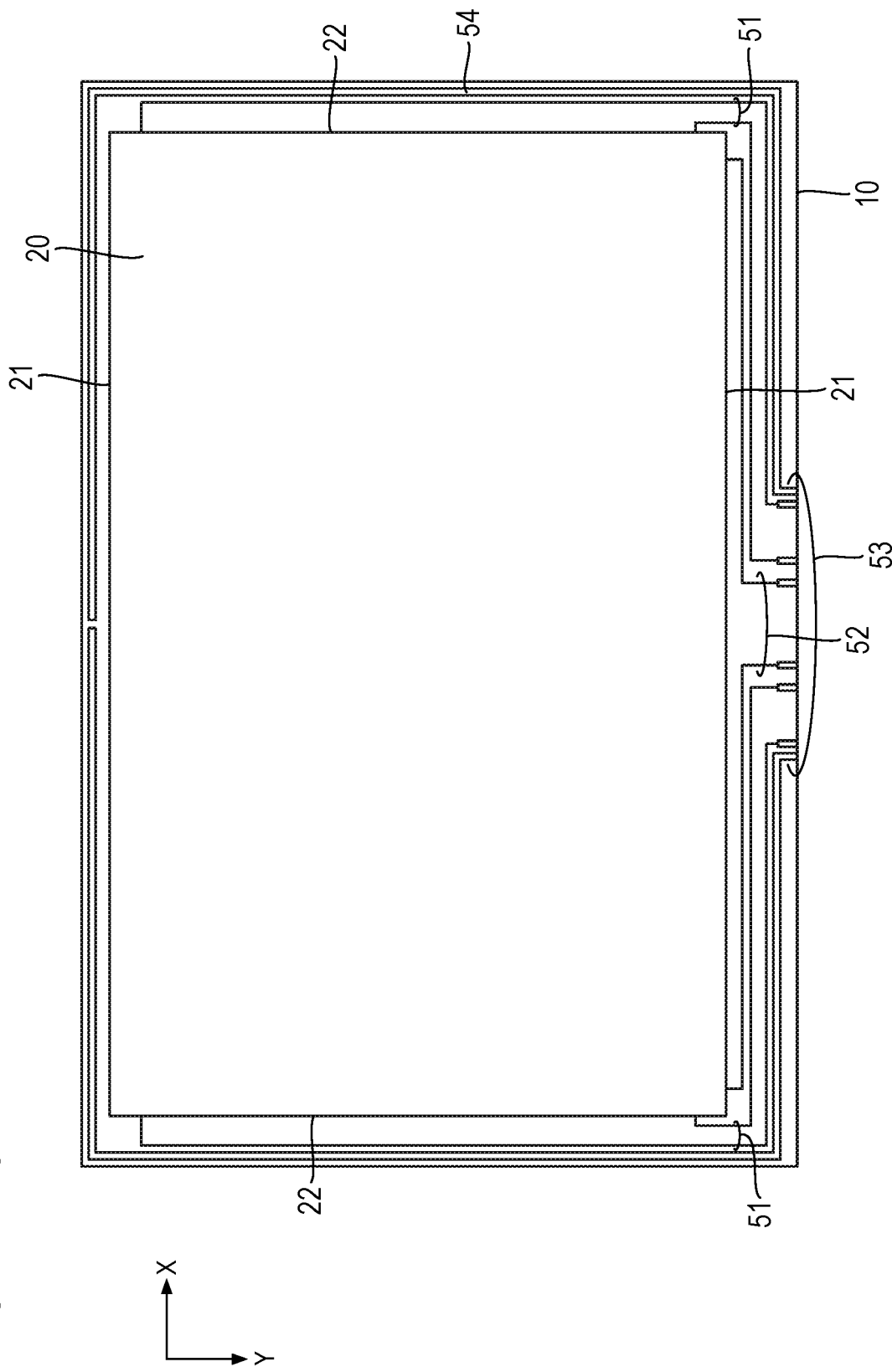
FIG. 1 is a diagram illustrating an example of a conventional configuration of a touch panel.
Figure 2A:
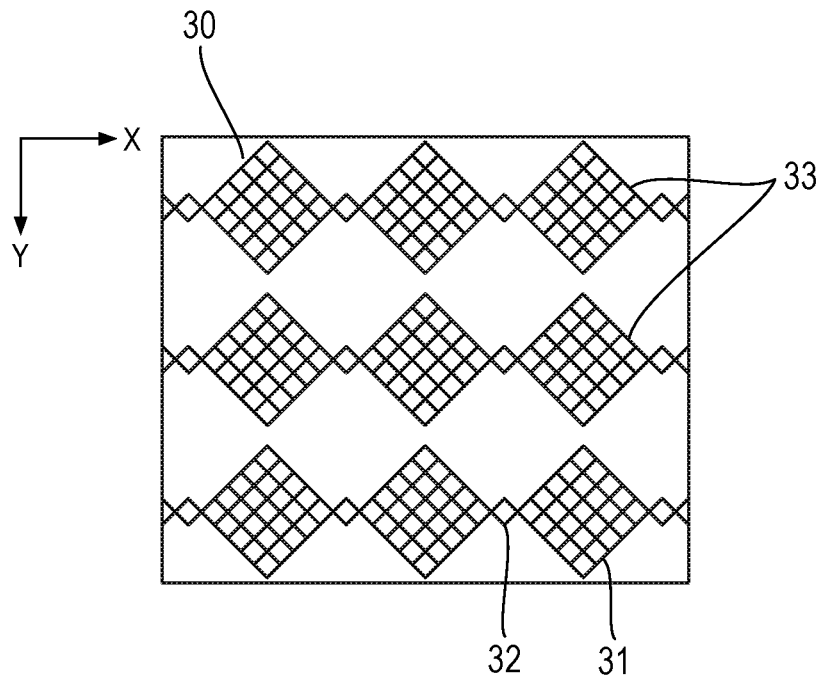
FIG. 2A is a partial enlarged view illustrating a first conductor layer of the touch panel illustrated in FIG. 1.
Figure 2B:
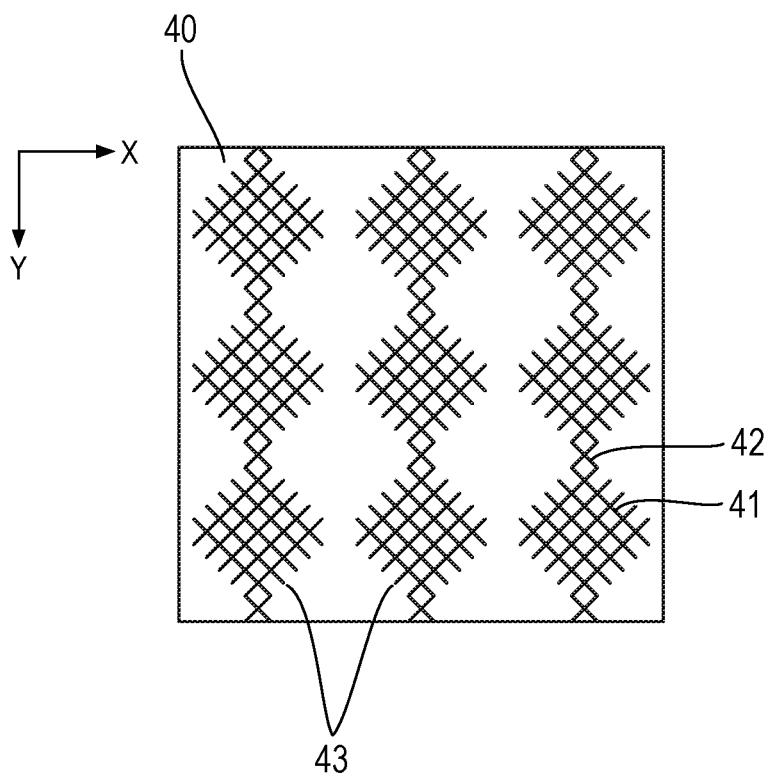
FIG. 2B is a partial enlarged view illustrating a second conductor layer of the touch panel illustrated in FIG. 1.
Figure 3:
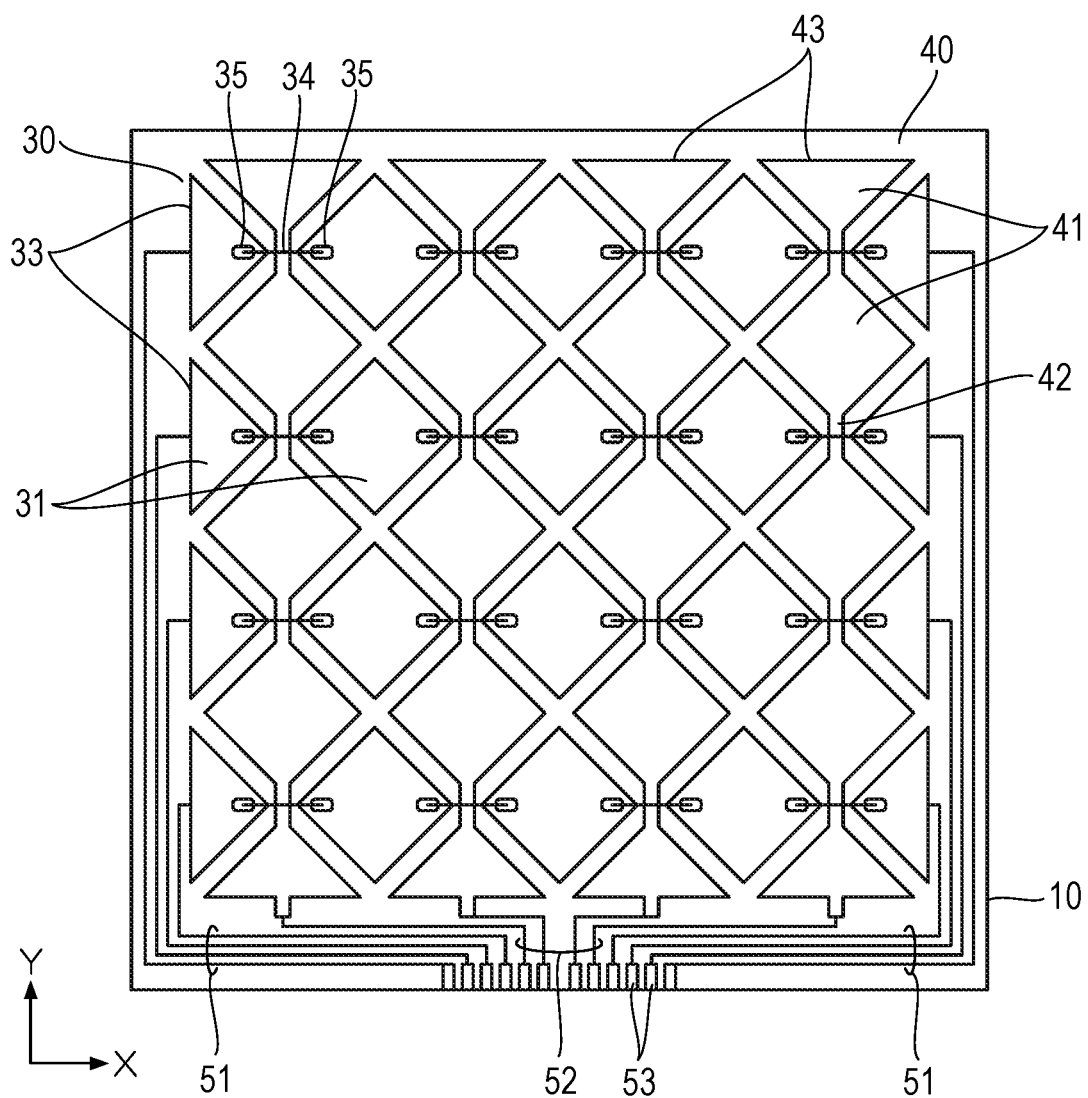
FIG. 3 is a diagram illustrating another example of a conventional configuration of a touch panel.

The touch panel in this example differs from the example conventional touch panel illustrated in FIG. 1 in the configuration of external connection terminals formed in an array in the center portion of one of the long sides of the substrate 10 and the configuration in the sensing region 20. The other configurations are basically the same as the configurations illustrated in FIG. 1. Note that details of the configuration in the sensing region 20 are omitted from FIG. 6.

The touch panel has a layered structure in which a first conductor layer made of a first hardened conductive ink, an insulating layer, a second conductor layer made of a second hardened conductive ink, and a protective coating are formed in this order in the sensing region 20 defined on one side of the transparent substrate 10. The insulating layer and the protective coating are made of transparent materials.

External connection terminals 60 located outside the sensing region 20 comprise a first terminal layer 61 made of the first hardened conductive ink and a second terminal layer 62 made of the second hardened conductive ink which are directly overlaid on one another. The first terminal layer 61 forms a first mesh of fine lines as illustrated in FIG. 4A and the second terminal layer 62 forms a second mesh of fine lines as illustrated in FIG. 4B.

Each of the first mesh of fine lines of the first terminal layer 61 and the second mesh of fine lines of the second terminal layer 62 has a grid pattern having a pair of periodicity directions and a pair of grid periods corresponding thereto. The grid pattern of the first mesh of fine lines and the grid pattern of the second mesh of fine lines are identical to each other in terms of the pair of periodicity directions and the pair of grid periods. In this example, each of the grid pattern of the first mesh of fine lines and the grid pattern of the second mesh of fine lines has square unit cells with a side length of 20 μm and the grid periods in the pair of periodicity directions are 20 μm. The width of each fine line of the meshes is 7 μm.

The width and length of the first terminal layer 61 formed of the mesh of fine lines described above are denoted by W1 and L1, respectively, as indicated in FIG. 4A and the width and length of the second terminal layer 62 formed of the mesh of fine lines described above are denoted by W2 and L2, respectively, as indicted in FIG. 4B, where $$L1=L2, W1>W2$$

in this example. That is, the width W2 of the second terminal layer 62 is smaller than the width W1 of the first terminal layer 61.

The second terminal layer 62 is directly overlaid on the first terminal layer 61 to produce a configuration of the external connection terminals 60 as illustrated in FIG. 5. In this example, the first terminal layer 61 and the second terminal layer 62 are overlaid on each other in such a way that they are deviated from each other in both of the pair of periodicity directions, respectively by ½ of the grid period, thereby producing a dense mesh with a grid period of 10 μm as illustrated in FIG. 5. It should be noted that making the width W2 of the second terminal layer 62 smaller than the width W1 of the first terminal layer 61 as described above prevents problems such as contact and short circuit of the second terminal layer 62 with an adjacent portion of the first terminal layer 61 due to misalignment during printing of the second terminal layer 62, for example.

The external connection terminals 60 having the configuration described above are connected to electrodes of an FPC 66, which is an external circuit, through an anisotropic conductive film (ACF) 65 in this example as illustrated in FIG. 6. Note that the electrodes of the FPC 66 are omitted from FIG. 6.

The anisotropic conductive film 65 used for connection between the external connection terminals 60 and the electrodes of the FPC 66 contains conductive particles which are resin particles plated with Au, for example. The anisotropic conductive film 65 in this example contains conductive particles each having a diameter of 10 µm or greater.

The configuration of the external connection terminals 60 of one example embodiment of the touch panel according to the present invention and connection between the external connection terminals 60 and the FPC 66 have been described above. In this example, the external connection terminals 60 comprise two layers, i.e. the first terminal layer 61 formed by a first conductor layer and the second terminal layer 62 formed by a second conductor layer which are overprinted without an insulating layer between them, instead of a single, first conductor layer alone as with conventional external connection terminals. Further, the first and second terminal layers 61, 62 formed of meshes of fine lines have the same grid pattern, which are overlaid on each other in such a way that they are deviated from each other in both of the pair of periodicity directions, respectively by ½ of the grid period.

Since this makes the mesh that forms the external connection terminals 60 in this example denser to increase the wiring density and increase the area of contact with the conductive particles in the anisotropic conductive film 65, the contact resistance can be reduced and the electrical contact quality can be improved over conventional external connection terminals. It should be noted that using the anisotropic conductive film 65 containing conductive particles each having a diameter of 10 µm or greater for connection with the external connection terminals 60 in the form of a mesh with a grid period of 10 µm as described above can significantly increase the probability of contact of the conductive particles with the fine lines of the mesh and therefore can further reduce the contact resistance.

While the mesh of fine lines of the first terminal layer 61 in the form of the grid pattern and the mesh of fine lines of the second terminal layer 62 in the form of the grid pattern are overlaid on each other in such a way that they are deviated from each other in both of the pair of periodicity directions, respectively by ½ of the grid period corresponding to the periodicity direction in the example described above, the deviation between the grid patterns overlaid on each other does not necessarily need to be ½ of the grid period. For example, the deviation between the grid patterns overlaid on each other may be from ¼ to ¾, inclusive, of the grid period in both of the pair of periodicity directions. Note that the grid pattern of the first terminal layer 61 and the grid pattern of the second terminal layer 62 may be overlaid on each other without deviation from each other and even if the grid patterns are overlaid on each other without deviation, the cross-sectional area of each fine line is doubled and therefore the advantageous effect of reducing the electrical resistance by half and the advantageous effect of enhancing the mechanical strength can be achieved.

Further, the unit cell of the grid pattern formed by the first terminal layer 61 and the second terminal layer 62 is not limited to a square shape but may be any other shapes such as a rhombus shape.

Figure 7:
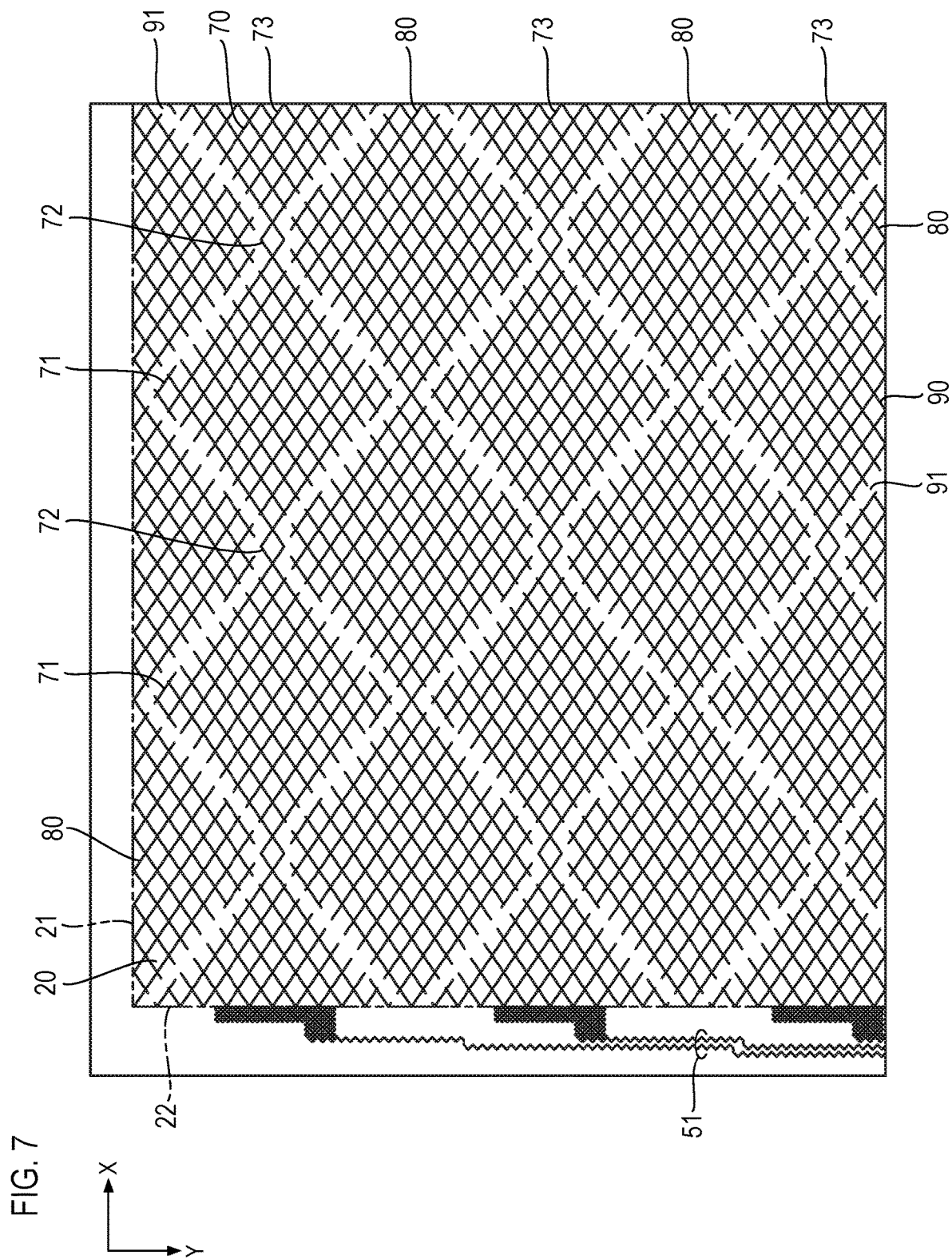
FIG. 7 is a partial enlarged view illustrating a first conductor layer of a sensing region in one example embodiment of the touch panel according to the present invention.
Figure 8:
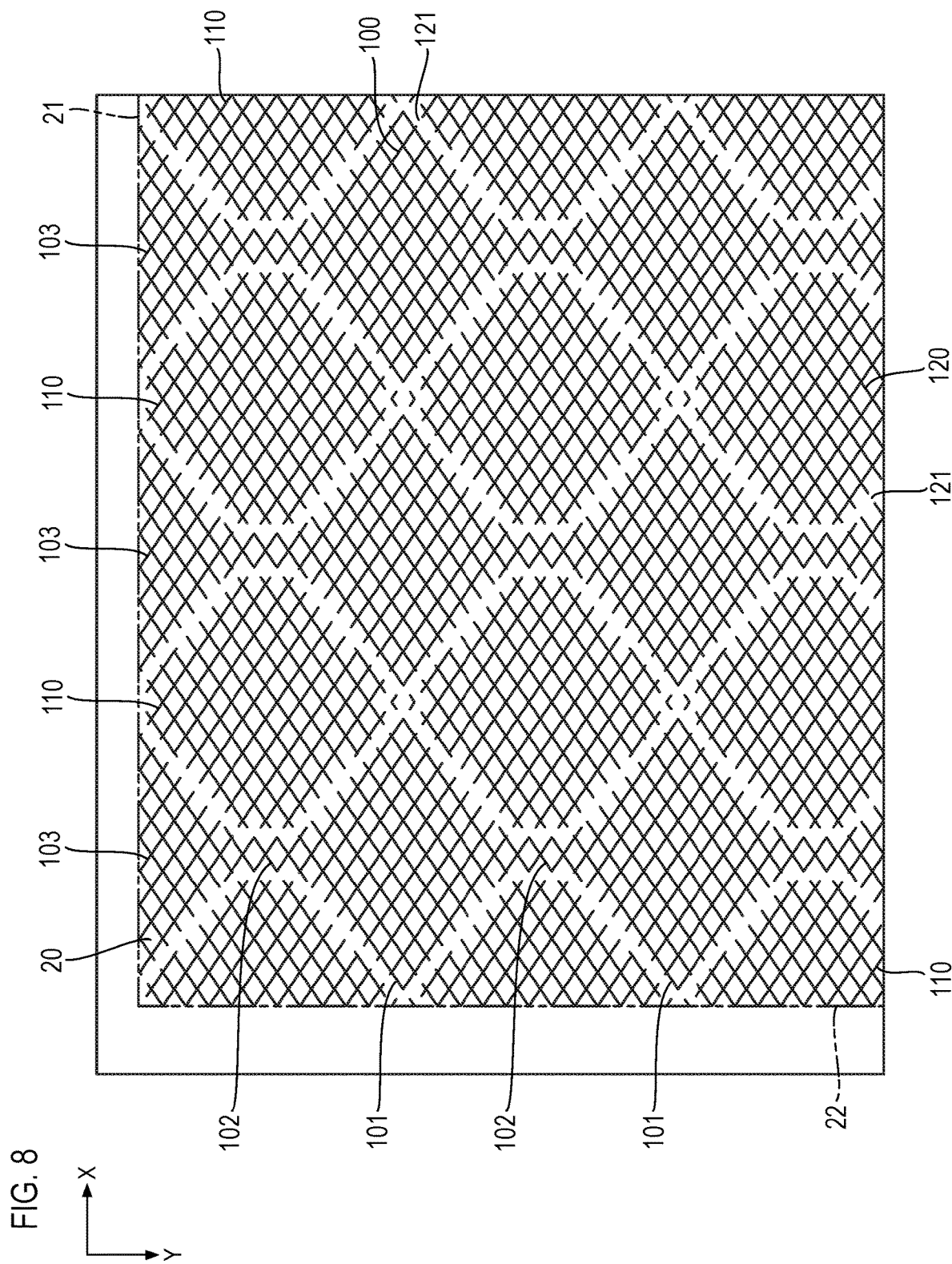
FIG. 8 is a partial enlarged view illustrating a second conductor layer of a sensing region in one example embodiment of the touch panel according to the present invention.
Figure 9:
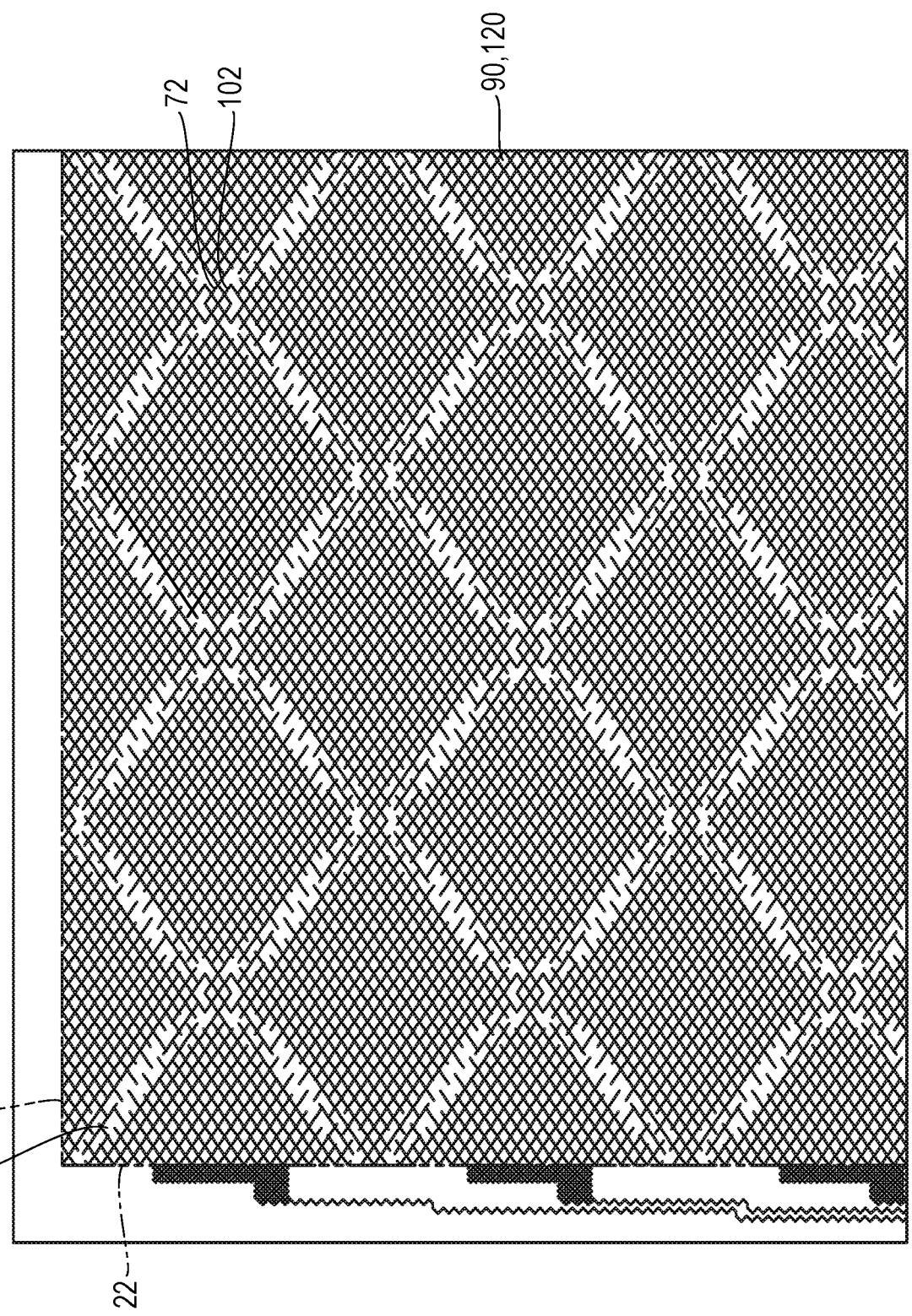
FIG. 9 is a partial enlarged view illustrating the first conductor layer illustrated in FIG. 7 and the second conductor layer illustrated in FIG. 8 which are overlaid on one another.

A configuration of the sensing region 20 will be described next with reference to FIGS. 7 to 9. FIGS. 7 to 9 illustrate details of the upper left part of FIG. 6.

FIG. 7 illustrates details of the printed wirings of the first conductor layer. A first sensor electrode 70 and a first dummy wiring 80 are formed in the sensing region 20. The first sensor electrode 70 comprises a plurality of electrode rows 73 parallelly arranged in the Y direction, where each of the electrode rows 73 is made up of a plurality of island-like electrodes 71 arranged in the X direction and linked with one another through linkage parts 72. The first dummy wiring 80 is provided in regions in the sensing region 20 other than regions in which the first sensor electrode 70 is provided and are insulated from the first sensor electrode 70.

Each of the first sensor electrode 70 and the first dummy wiring 80 is formed of a mesh of fine lines and shares a first mesh pattern 90 which is a single continuous periodic mesh pattern while gaps 91 where fine lines are broken are formed and disposed at the boundary between the first sensor electrode 70 and the first dummy wiring 80. A unit cell of the first mesh pattern 90 in this example is in the shape of a rhombus with a side length of 400 µm and the width of each of the fine lines making up the mesh is 7 µm. The gaps 91 that insulate between the first sensor electrode 70 and the first dummy wiring 80 are approximately 20 µm. The gaps 91 are depicted relatively enlarged in FIG. 7.

FIG. 8, on the other hand, illustrates details of printed wirings of the second conductor layer. A second sensor electrode 100 and a second dummy wiring 110 are formed in the sensing region 20. The second sensor electrode 100 comprises a plurality of electrode rows 103 parallelly arranged in the X direction, where each of the electrode rows 103 is made up of a plurality of island-like electrodes 101 arranged in the Y direction and linked with one another through linkage parts 102. The second dummy wiring 110 is provided in regions in the sensing region 20 other than regions in which the second sensor electrode 100 is provided and are insulated from the second sensor electrode 100.

Each of the second sensor electrode 100 and the second dummy wiring 110 is formed of a mesh of fine lines and shares a second mesh pattern 120 which is a single continuous periodic mesh pattern while gaps 121 where fine lines are broken are formed and disposed at the boundary between the second sensor electrode 100 and the second dummy wiring 110. The second mesh pattern 120 in this example is identical to the first mesh pattern 90 and the angle which each of the fine lines making up the mesh forms with the long side 21 of the sensing region 20 is also identical to that in the first mesh pattern 90. Note that the gaps 121 are depicted relatively enlarged as in FIG. 7.

FIG. 9 illustrates the printed wirings of the first conductor layer illustrated in FIG. 7 and the printed wirings of the second conductor layer illustrated in FIG. 8 which are stacked with the insulating layer between them. The first mesh pattern 90 of the first conductor layer and the second mesh pattern 120 of the second conductor layer are overlaid on each other in such a way that they intersect at the midpoint that divides each side of the rhombus shape of each unit cell into two 200 µm segments. Consequently, rhombus-shaped cells with a side length of 200 µm are highly uniformly formed in the entire sensing region 20 as illustrated in FIG. 9. It should be noted that the electrode rows 73 of the first sensor electrode 70 and the electrode rows 103 of the second sensor electrode 100 intersect, with the linkage parts 72 and 102 being positioned in locations that coincide with each other.

In this way, in the present example, the first mesh pattern 90 uniformly exists in the sensing region 20 of the first conductor layer in which the first sensor electrode 70 is formed, and the second mesh pattern 120 uniformly exists in the sensing region 20 of the second conductor layer in which the second sensor electrode 100 is formed. Accordingly, visual contrast due to the presence and absence of the meshes of fine lines does not occur in any of the first conductor layer and the second conductor layer and naturally visual contrast does not occur when the first conductor layer and the second conductor layer are overlaid on each other, whereby contrast in the sensing region 20 can be completely eliminated.

A method for producing the touch panel described above will be described below.

1) First Printing Step

The first conductor layer (first mesh pattern 90) of the sensing region 20 and the first terminal layer 61 are simultaneously printed on one side of the substrate 10 by using a first conductive ink. At the same time, the leads 51, 52 and ground wiring 54 are also simultaneously printed.

2) Second Printing Step

The insulating layer is printed on the first conductor layer of the sensing region 20 by using an insulating ink.

3) Third Printing Step

The second conductor layer (second mesh pattern 120) of the sensing region 20 and the second terminal layer 62 are simultaneously printed by using a second conductive ink.

4) Fourth Printing Step

The protective coating is printed on the entire area of the one side of the substrate 10 using an insulating ink, excluding the regions in which the external connection terminals 60 made up of the first and second terminal layers 61, 62 are formed in an array.

The touch panel is produced by these steps. Note that the first conductive ink used in the first printing step and the second conductive ink used in the third printing step are the same ink containing conductive particles such as silver particles and gravure offset printing is used as the printing method in this example. Different blankets are used in the gravure offset printing process in the first printing step and the gravure offset printing process in the third printing step and the two blankets are alternately used. The reasons are as follows.

If the external connection terminals 60, which are dense meshes as illustrated in FIG. 5, are formed by printing at a time, the problem of rapid swelling of the blanket can occur due to printing of the material of the highly dense wiring. To address this problem, different blankets are used in the first printing step and the third printing step and the two blankets are alternately used. By alternately using the two blankets to print the external connection terminals 60, swelling of the blankets can be slowed down sufficiently (approximately by a factor of 2) compared to using a single blanket to print external connection terminals with the same wiring density. This can increase the mass productivity of the touch panel.

A touch panel and a touch panel production method according to the present invention have been described above. External connection terminals may be printed in three ink layers in the case where production of a touch panel involves three printing steps using a conductive ink, namely the step of printing the first sensor electrode, the step of printing the second sensor electrode and the step of printing leads (frame wirings), for example.

What is claimed is:

1. A touch panel comprising:
  a substrate;
  a layered structure formed in a sensing region defined on one side of the substrate, the layered structure including at least a first conductor layer made of a first hardened conductive ink, a second conductor layer made of a second hardened conductive ink and an insulating layer disposed therebetween; and
  an external connection terminal formed outside the sensing region on the one side of the substrate;
  wherein the external connection terminal comprises a first terminal layer made of the first hardened conductive ink and a second terminal layer made of the second hardened conductive ink, such that the first terminal layer and the second terminal layer are directly overlaid on each other at a most terminal end of a conductive path of the touch panel;
  wherein the first terminal layer forms a first mesh of fine lines and the second terminal layer forms a second mesh of fine lines;
  wherein each of the first mesh of fine lines and the second mesh of fine lines has a grid pattern having a pair of periodicity directions and a pair of grid periods corresponding thereto, such that the first mesh of fine lines and the second mesh of fine lines are identical to each other in terms of the pair of periodicity directions and the pair of grid periods; and
  the first mesh of fine lines and the second mesh of fine lines are overlaid on each other in such a way that the first mesh of fine lines and the second mesh of fine lines are deviated from each other in both of the pair of periodicity directions, respectively by from ¼ to ¾, inclusive, of the grid period corresponding to the periodicity direction.

2. The touch panel according to claim 1,
  further comprising an anisotropic conductive film connected to the external connection terminal;
  wherein the pair of grid periods are equal to each other; and
  the anisotropic conductive film contains a plurality of conductive particles each having a diameter greater than or equal to ½ of the grid period;
  whereby the external connection terminal may be connected to an electrode of an external circuit through the anisotropic conductive film.

3. The touch panel according to claim 1,
  wherein each of the first conductor layer and the second conductor layer forms a mesh of fine lines.

4. The touch panel according to claim 2,
  wherein each of the first conductor layer and the second conductor layer forms a mesh of fine lines.

5. A touch panel production method for producing the touch panel according to claim 1, the method comprising:
  simultaneously printing the first conductor layer and the first terminal layer on the one side of the substrate by using a first conductive ink;
  printing the insulating layer by using an insulating ink; and
  simultaneously printing the second conductor layer and the second terminal layer by using a second conductive ink.

6. A touch panel production method for producing the touch panel according to claim 2, the method comprising:
  simultaneously printing the first conductor layer and the first terminal layer on the one side of the substrate by using a first conductive ink;
  printing the insulating layer by using an insulating ink; and
  simultaneously printing the second conductor layer and the second terminal layer by using a second conductive ink.

7. A touch panel production method for producing the touch panel according to claim 3, the method comprising:

simultaneously printing the first conductor layer and the first terminal layer on the one side of the substrate by using a first conductive ink;

printing the insulating layer by using an insulating ink; and simultaneously printing the second conductor layer and the second terminal layer by using a second conductive ink.

8. A touch panel production method for producing the touch panel according to claim 4, the method comprising:

simultaneously printing the first conductor layer and the first terminal layer on the one side of the substrate by using a first conductive ink;

printing the insulating layer by using an insulating ink; and simultaneously printing the second conductor layer and the second terminal layer by using a second conductive ink.

9. The touch panel production method according to claim 5, wherein the simultaneously printing the first conductor layer and the first terminal layer on the one side of the substrate by using the first conductive ink is a gravure offset printing process using a first blanket; and the simultaneously printing the second conductor layer and the second terminal layer by using the second conductive ink is a gravure offset printing process using a second blanket.

10. The touch panel production method according to claim 6, wherein the simultaneously printing the first conductor layer and the first terminal layer on the one side of the substrate by using the first conductive ink is a gravure offset printing process using a first blanket; and the simultaneously printing the second conductor layer and the second terminal layer by using the second conductive ink is a gravure offset printing process using a second blanket.

11. The touch panel production method according to claim 7, wherein the simultaneously printing the first conductor layer and the first terminal layer on the one side of the substrate by using the first conductive ink is a gravure offset printing process using a first blanket; and the simultaneously printing the second conductor layer and the second terminal layer by using the second conductive ink is a gravure offset process printing using a second blanket.

12. The touch panel production method according to claim 8, wherein the simultaneously printing the first conductor layer and the first terminal layer on the one side of the substrate by using the first conductive ink is a gravure offset printing process using a first blanket; and the simultaneously printing the second conductor layer and the second terminal layer by using the second conductive ink is a gravure offset printing process using a second blanket.

* * * * *